US011856360B2

(12) United States Patent
Post et al.

(10) Patent No.: US 11,856,360 B2
(45) Date of Patent: Dec. 26, 2023

(54) VIBRATION SENSOR

(71) Applicant: Sonion Nederland B.V., Hoofddorp (NL)

(72) Inventors: Peter Christian Post, Hoofddorp (NL); Raymond Mögelin, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 0 days.

(21) Appl. No.: 17/678,423

(22) Filed: Feb. 23, 2022

(65) Prior Publication Data

US 2022/0182753 A1 Jun. 9, 2022

Related U.S. Application Data

(63) Continuation of application No. 16/269,404, filed on Feb. 6, 2019, now Pat. No. 11,350,208.

(30) Foreign Application Priority Data

Apr. 30, 2018 (EP) ..................................... 18170039

(51) Int. Cl.
*H04R 1/28* (2006.01)
*B81B 7/00* (2006.01)
*G01H 3/06* (2006.01)
*H04R 1/38* (2006.01)

(52) U.S. Cl.
CPC ......... *H04R 1/2807* (2013.01); *B81B 7/0016* (2013.01); *G01H 3/06* (2013.01); *H04R 1/38* (2013.01); *B81B 2201/0257* (2013.01)

(58) Field of Classification Search
CPC .......... H04R 1/2807; H04R 1/38; G01H 3/06; B81B 2201/0257; B81B 7/0016

USPC ......................................................... 73/649
See application file for complete search history.

(56) References Cited

U.S. PATENT DOCUMENTS

| | | | |
|---|---|---|---|
| 3,978,731 A | 9/1976 | Reeder |
| 6,140,689 A | 10/2000 | Scheiter |
| 6,788,796 B1 | 9/2004 | Miles |
| 6,831,577 B1 | 12/2004 | Furst |
| 6,853,290 B2 | 2/2005 | Jorgensen |
| 6,859,542 B2 | 2/2005 | Johannsen |
| 6,888,408 B2 | 5/2005 | Furst |

(Continued)

FOREIGN PATENT DOCUMENTS

| | | |
|---|---|---|
| CN | 1228837 A | 9/1999 |
| CN | 1411552 A | 4/2003 |

(Continued)

OTHER PUBLICATIONS

Extended European Search Report for Application No. EP 18170039.4 dated Nov. 13, 2018 (4 pages).

*Primary Examiner* — Nathaniel T Woodward
*Assistant Examiner* — Rose M Miller
(74) *Attorney, Agent, or Firm* — Nixon Peabody LLP

(57) ABSTRACT

The present invention relates to a vibration sensor comprising a pressure generating element for generating pressure differences between a first and a second volume in response to vibrations of the vibration sensor, the first and second volumes being acoustically sealed from each other, and a pressure transducer for measuring pressure differences between the first and second volumes. The present invention also relates to an associated method for detecting vibrations.

23 Claims, 7 Drawing Sheets

(56) References Cited

U.S. PATENT DOCUMENTS

| | | |
|---|---|---|
| 6,914,992 B1 | 7/2005 | van Halteren |
| 6,919,519 B2 | 7/2005 | Ravnkilde |
| 6,930,259 B1 | 8/2005 | Jorgensen |
| 6,943,308 B2 | 9/2005 | Ravnkilde |
| 6,974,921 B2 | 12/2005 | Jorgensen |
| 7,008,271 B2 | 3/2006 | Jorgensen |
| 7,012,200 B2 | 3/2006 | Moller |
| 7,062,058 B2 | 6/2006 | Steeman |
| 7,062,063 B2 | 6/2006 | Hansen |
| 7,072,482 B2 | 7/2006 | Van Doorn |
| 7,088,839 B2 | 8/2006 | Geschiere |
| 7,110,560 B2 | 9/2006 | Stenberg |
| 7,136,496 B2 | 11/2006 | van Halteren |
| 7,142,682 B2 | 11/2006 | Mullenborn |
| 7,181,035 B2 | 2/2007 | van Halteren |
| 7,190,803 B2 | 3/2007 | van Halteren |
| 7,206,428 B2 | 4/2007 | Geschiere |
| 7,221,767 B2 | 5/2007 | Mullenborn |
| 7,221,769 B1 | 5/2007 | Jorgensen |
| 7,227,968 B2 | 6/2007 | van Halteren |
| 7,239,714 B2 | 7/2007 | de Blok |
| 7,245,734 B2 | 7/2007 | Niederdraenk |
| 7,254,248 B2 | 8/2007 | Johannsen |
| 7,286,680 B2 | 10/2007 | Steeman |
| 7,292,700 B1 | 11/2007 | Engbert |
| 7,292,876 B2 | 11/2007 | Bosh |
| 7,336,794 B2 | 2/2008 | Furst |
| 7,376,240 B2 | 5/2008 | Hansen |
| 7,403,630 B2 | 7/2008 | Jorgensen |
| 7,415,121 B2 | 8/2008 | Mögelin |
| 7,425,196 B2 | 9/2008 | Jorgensen |
| 7,460,681 B2 | 12/2008 | Geschiere |
| 7,466,835 B2 | 12/2008 | Stenberg |
| 7,492,919 B2 | 2/2009 | Engbert |
| 7,548,626 B2 | 6/2009 | Stenberg |
| 7,657,048 B2 | 2/2010 | van Halteren |
| 7,684,575 B2 | 3/2010 | van Halteren |
| 7,706,561 B2 | 4/2010 | Wilmink |
| 7,715,583 B2 | 5/2010 | Van Halteren |
| 7,728,237 B2 | 6/2010 | Pedersen |
| 7,809,151 B2 | 10/2010 | Van Halteren |
| 7,822,218 B2 | 10/2010 | Van Halteren |
| 7,899,203 B2 | 3/2011 | Van Halteren |
| 7,912,240 B2 | 3/2011 | Madaffari |
| 7,946,890 B1 | 5/2011 | Bondo |
| 7,953,241 B2 | 5/2011 | Jorgensen |
| 7,961,899 B2 | 6/2011 | Van Halteren |
| 7,970,161 B2 | 6/2011 | van Halteren |
| 8,098,854 B2 | 1/2012 | van Halteren |
| 8,101,876 B2 | 1/2012 | Andreasen |
| 8,103,039 B2 | 1/2012 | van Halteren |
| 8,160,290 B2 | 4/2012 | Jorgensen |
| 8,170,249 B2 | 5/2012 | Halteren |
| 8,189,804 B2 | 5/2012 | Hruza |
| 8,189,820 B2 | 5/2012 | Wang |
| 8,223,996 B2 | 7/2012 | Beekman |
| 8,233,652 B2 | 7/2012 | Jorgensen |
| 8,259,963 B2 | 9/2012 | Stenberg |
| 8,259,976 B2 | 9/2012 | van Halteren |
| 8,259,977 B2 | 9/2012 | Jorgensen |
| 8,280,082 B2 | 10/2012 | van Halteren |
| 8,284,966 B2 | 10/2012 | Wilk |
| 8,313,336 B2 | 11/2012 | Bondo |
| 8,315,422 B2 | 11/2012 | van Halteren |
| 8,331,595 B2 | 12/2012 | van Halteren |
| 8,369,552 B2 | 2/2013 | Engbert |
| 8,379,899 B2 | 2/2013 | van Halteren |
| 8,509,468 B2 | 8/2013 | van Halteren |
| 8,526,651 B2 | 9/2013 | Lafort |
| 8,526,652 B2 | 9/2013 | Ambrose |
| 9,516,421 B1 | 12/2016 | Loeppert |
| 11,350,208 B2 * | 5/2022 | Post ............... H04R 1/38 |
| 2004/0244492 A1 | 12/2004 | Berstis |
| 2005/0257621 A1 | 11/2005 | Kang |
| 2006/0192966 A1 | 8/2006 | Moeckli |
| 2008/0006093 A1 | 1/2008 | Ueya |
| 2009/0267168 A1 | 10/2009 | Sawada |
| 2010/0275675 A1 | 11/2010 | Seppa |
| 2011/0182453 A1 | 7/2011 | van Hal |
| 2011/0189880 A1 | 8/2011 | Bondo |
| 2011/0299708 A1 | 12/2011 | Bondo |
| 2011/0299712 A1 | 12/2011 | Bondo |
| 2011/0311069 A1 | 12/2011 | Ambrose |
| 2012/0014548 A1 | 1/2012 | van Halteren |
| 2012/0027245 A1 | 2/2012 | van Halteren |
| 2012/0140966 A1 | 6/2012 | Mocking |
| 2012/0155683 A1 | 6/2012 | van Halteren |
| 2012/0155694 A1 | 6/2012 | Reeuwijk |
| 2012/0255805 A1 | 10/2012 | van Halteren |
| 2013/0028451 A1 | 1/2013 | de Roo |
| 2013/0077443 A1 | 3/2013 | Onishi |
| 2013/0092471 A1 | 4/2013 | Krüger |
| 2013/0136284 A1 | 5/2013 | van Hal |
| 2013/0142370 A1 | 6/2013 | Engbert |
| 2013/0163799 A1 | 6/2013 | Van Halteren |
| 2013/0195295 A1 | 8/2013 | van Halteren |
| 2015/0003638 A1 | 1/2015 | Kasai |
| 2018/0058915 A1 | 3/2018 | Mögelin |

FOREIGN PATENT DOCUMENTS

| | | |
|---|---|---|
| CN | 1699927 A | 11/2005 |
| CN | 101106839 A | 1/2008 |
| CN | 101379373 A | 3/2009 |
| CN | 101970339 A | 2/2011 |
| CN | 102972046 A | 3/2013 |
| CN | 103114889 A | 5/2013 |
| EP | 3252444 A1 | 12/2017 |
| EP | 3279621 A1 | 2/2018 |
| SE | 7501968 L | 8/1975 |
| WO | WO 2009/071746 A1 | 6/2009 |

* cited by examiner

VIBRATION SENSOR

CROSS-REFERENCE TO RELATED APPLICATIONS

This application is a continuation of U.S. patent application Ser. No. 16/269,404, filed on Feb. 6, 2019, which claims priority to and the benefit of European Application No. 18170039.4, filed Apr. 30, 2018, each of which is incorporated by reference in its entirety.

FIELD OF THE INVENTION

The present invention relates to a vibration sensor comprising a pressure transducer for measuring pressure differences between a first and a second volume being acoustically sealed from each other. The pressure differences between the first and second volumes are generated by a pressure generating element in response to vibrations of the vibration sensor.

BACKGROUND OF THE INVENTION

Vibration sensors of today mostly rely on microelectromechanical systems (MEMS), i.e. MEMS based vibration sensors. However, an intrinsic and large drawback of traditional MEMS based vibration sensors is the limited weight of the moveable mass as this limitation has a significant impact on the fundamental noise floor of the vibration sensors, i.e. the Johnson-Nyquist noise level.

In order to deal with the above-mentioned noise issues an often applied strategy to lower the noise floor is to limit the bandwidth of the vibration sensor. However, this approach makes most MEMS based vibration sensors incompatible with own voice pickup.

Thus, there seems to be a need for MEMS based vibration sensors having both an acceptable noise floor level as well as an acceptable bandwidth.

It may thus be seen as an object of embodiments of the present invention to provide a vibration sensor having an acceptable balance between noise floor level, bandwidth and size. It may be seen as a further object of embodiments of the present invention to provide a vibration sensor having a considerably smaller volume compared to traditional vibration sensor systems.

DESCRIPTION OF THE INVENTION

The above-mentioned object is complied with by providing, in a first aspect, a vibration sensor comprising (i) a pressure generating element for generating pressure differences between a first and a second volume in response to vibrations of the vibration sensor, the first and second volumes being acoustically sealed from each other, and (ii) a pressure transducer for measuring pressure differences between the first and second volumes.

The present invention thus relates to a vibration sensor comprising a pressure generating element and a pressure transducer adapted to measure pressure differences between a first volume and a second volume. These pressure differences are generated by the pressure generating element in response to vibrations of the vibration sensor.

The pressure transducer and the pressure generating element are arranged in parallel which is advantageous in that it eliminates the need for compliant volumes in connection with both the pressure transducer and the pressure generating element. With no compliant volumes the design of the vibration sensor can be made considerably smaller. Moreover, the sensitivity of the vibration sensor according to the present invention may be significantly increased by reducing the volume.

The pressure generating element and the pressure transducer may form part of, or may be secured to, an arrangement that acoustically seals the first volume from the second volume. Typically, the first and second volumes form part of the vibration sensor.

The pressure generating element may interact directly with air of the first and second volumes. One possible way to comply with this may involve that the pressure generating element is adjacently arranged relative to the first and second volumes. By adjacent is meant that the pressure generating element may form at least part of a boundary or wall that separates the first volume from the second volume.

The pressure generating element may be implemented in various ways. In one embodiment the pressure generating element may comprise a moveable element operatively connected to a static element via one or more resilient interconnections. By resilient is meant that the moveable element seeks towards a centre position when not being exposed to vibrations. The static and moveable elements, and the one or more resilient interconnections may form, in combination, a one piece component, i.e. a component being made of the same material. The one or more resilient interconnections may form one or more hinges between the static element and the moveable element.

One or more openings may be provided between the static element and the moveable element so that at least part of the moveable element is allowed to move relative to the static element in response to vibrations of the vibration sensor.

The static and moveable elements, and the one or more resilient interconnections, may be formed by a printed circuit board (PCB) having one or more electrically conducting paths arranged thereon. The one or more electrically conducting paths may be adapted to guide electrical signals to and/or from the pressure transducer and/or other electronic circuits.

Alternatively, the static and moveable elements, and the one or more resilient interconnections may constitute discrete components of different materials. Thus, the static element may be made of one material, the moveable element may be made of another material, and the one or more resilient interconnections may be made of yet another material. Also in this implementation one or more openings may be provided between the static element and the moveable element so that at least part of the moveable element is allowed to move relative to the static element in response to vibrations of the vibration sensor.

The static or movable element and/or the pressure transducer may comprise a small hole having a predetermined resistance between the first and second volumes. The predetermined resistance of the small hole induces a low-frequency roll-off. A viscoelastic substance may be arranged in the one or more openings between the static element and the moveable element so as to form an acoustic seal therebetween.

As it will be addressed in further details below the viscoelastic substance may have a viscosity within the range between 1000 and 100000 cP, such as between 2000 and 80000 cP, such as between 3000 and 50000 cP, such as between 4000 and 40000 cP, such as between 5000 and 30000 cP, such as between 6000 and 20000 cP, such as around 10000 cP. The viscoelastic substance may be an oil product in that oil is stable over time and it does not tend to evaporate. Moreover, oil comes with a wide range of viscosities. Other suitable candidates as viscoelastic substances may involve gels, magnetic fluids etc.

Alternatively or in combination therewith, a foil or membrane may be arranged in the one or more openings between the static element and the moveable element so as to form the acoustic seal therebetween.

In terms of implementation various embodiments exist. In one embodiment the pressure transducer may be secured to the moveable element. Moreover, a signal processing circuitry, such as an application specific integrated circuit (ASIC), for processing signals from the pressure transducer may be secured to the moveable element. Alternative, the signal processing circuitry for processing signals from the pressure transducer may be secured to the static element.

The ASIC may not be limited to processing signals from the pressure transducer. It may process or generate analogue or digital signals provided by or send to other transducers, DSPs or ASICs.

Instead of being secured to the moveable element the pressure transducer may be secured to the static element. While the pressure transducer is secured to the static element the signal processing circuitry for processing signals from the pressure transducer may be secured to the moveable element. Alternatively, the signal processing circuitry for processing signals from the pressure transducer may be secured to the static element. With both the pressure transducer and the signal processing circuitry secured to the static element a separate mass may be secured to the moveable element. The pressure transducer may comprise a MEMS pressure transducer. In order not increase the height of the vibration sensor the pressure transducer and the signal processing circuitry may be arranged next to each other, such as next to each other on a PCB forming the static and/or moveable elements.

To change the performance characteristics of the vibration sensor one or more additional masses may be added to the moveable element in order to reduce noise. The addition of such one or more additional masses is independent of the position of the pressure transducer and signal processing circuitry. The mass to spring stiffness ratio determines the sensitivity and peak frequency position of the vibration sensor.

In a second aspect the present invention relates to a personal device comprising a vibration sensor according to the first aspect, said personal device being selected from the group consisting of hearing aids, hearing devices, hearables, mobile communication devices and tablets.

In a third aspect the present invention relates to a method for detecting vibrations, the method comprising the steps of (i) generating pressure differences between a first and a second volume being acoustically sealed from each other, and (ii) measuring pressure differences between the first and second volumes using a pressure transducer.

The method according to the third aspect may be performed using a vibration sensor of the type disclosed in connection with the first aspect of the present invention.

BRIEF DESCRIPTION OF THE DRAWINGS

The present invention will now be described in further details with reference to the accompanying figures, wherein

FIG. 2b shows the details of the static element of the first embodiment of FIG. 2a.

FIG. 4b shows the details of the static element of the second embodiment of FIG. 4a.

FIG. 5b shows the details of the static element of the third embodiment of FIG. 5a.

Figure 1:
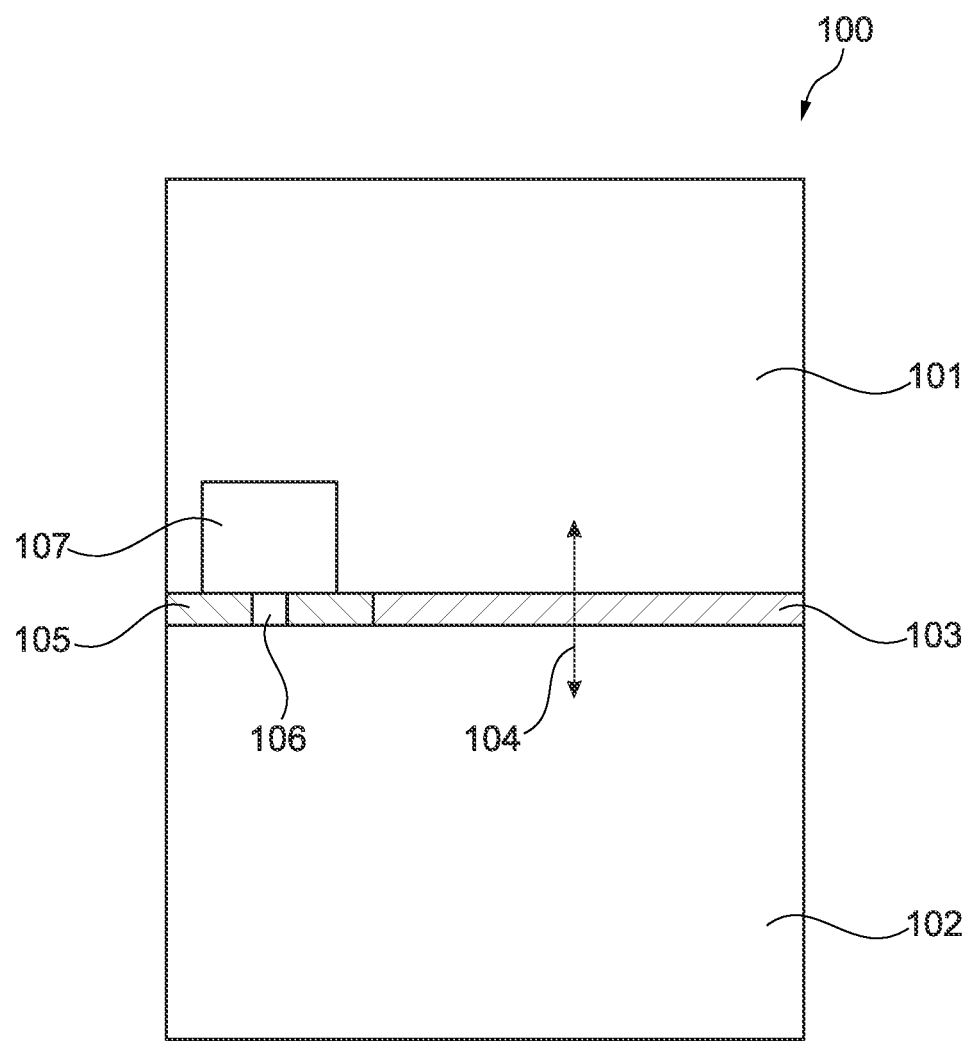
FIG. 1 shows a moveable mass system and a pressure transducer in parallel.

While the invention is susceptible to various modifications and alternative forms specific embodiments have been shown by way of examples in the drawings and will be described in details herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In its broadest aspect the present invention relates to a vibration sensor comprising a pressure transducer and a pressure generating element arranged in parallel. The pressure transducer is adapted to measure pressure differences between a first volume and a second volume. These pressure differences are generated by the pressure generating element in response to vibrations of the vibration sensor.

The parallel arrangement of the pressure transducer and the pressure generating element is advantageous in that it eliminates the need for a compliant volume in connection with both the pressure transducer and the pressure generating element whereby the design of the vibration sensor can be made considerably smaller. Moreover, the sensitivity of the vibration sensor according to the present invention may be significantly increased.

With reference to FIG. 1 the general principle of the present invention is depicted in the form of a vibration sensor 100 having a pressure transducer 107 and a pressure generating element 103 arranged in parallel. At least part of the pressure generating element 103 is adapted to move and/or bend as indicated by the arrow 104 when the vibration sensor is exposed to vibrations. The moving and/or bending of at least part of the pressure generating element 103 introduces pressure differences between the first volume 101 and the second volume 102 which are acoustically sealed from each other. The pressure transducer 107, which in FIG. 1 is secured to a static element 105 having a through-going opening 106, is adapted to measure the generated pressure differences between the first volume 101 and the second volume 102.

As seen in FIG. 1 the pressure generating element 103 interacts directly with air of the first 101 and second 102 volumes in that the pressure generating element 103 is adjacently arranged relative to the first 101 and second 102 volumes, i.e. the pressure generating element 103 forms at least part of a boundary or wall that separates the first volume 101 from the second volume 102. The dimensions of the first 101 and second 102 volumes should be kept as small as possible. Moreover, the compliance of the pressure transducer 107 should also be kept at a minimum although still suitable for sensing pressure variations. Finally, the surface of the pressure generating element should be as large as possible in order to secure proper acoustical amplification.

Thus, according to the present invention a pressure generating element 103 for generating pressure differences, and a pressure transducer 107 for detecting said pressure differences are arranged in parallel within a vibration sensor 100. It should be noted that the pressure transducer 107 and/or a signal processing circuitry electrically connected thereto may form part of the pressure generating element 103 as it will be demonstrated in the embodiments illustrated below.

Figure 2A:
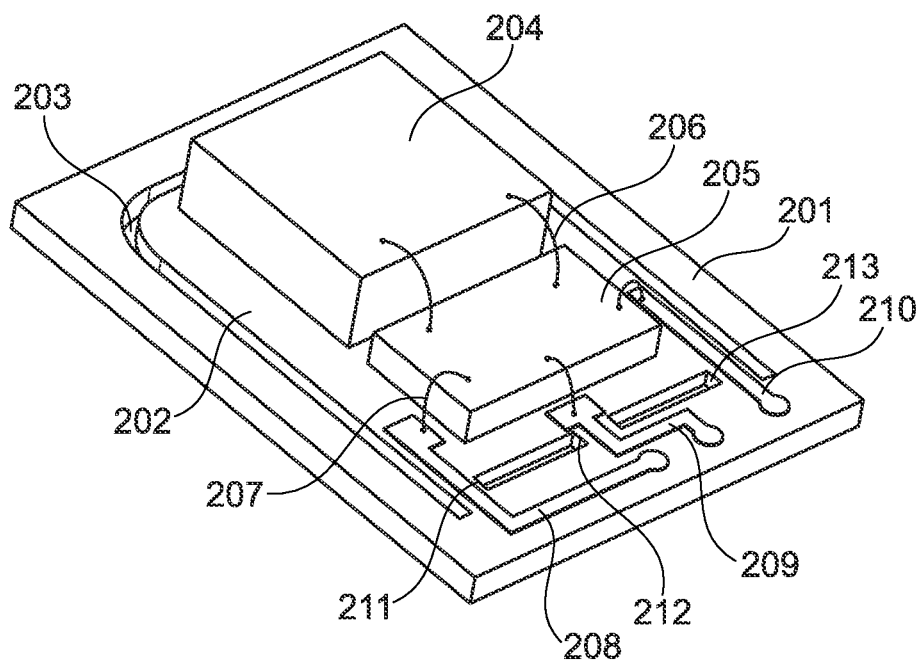
FIG. 2a shows a first embodiment of the present invention.
Figure 2B:
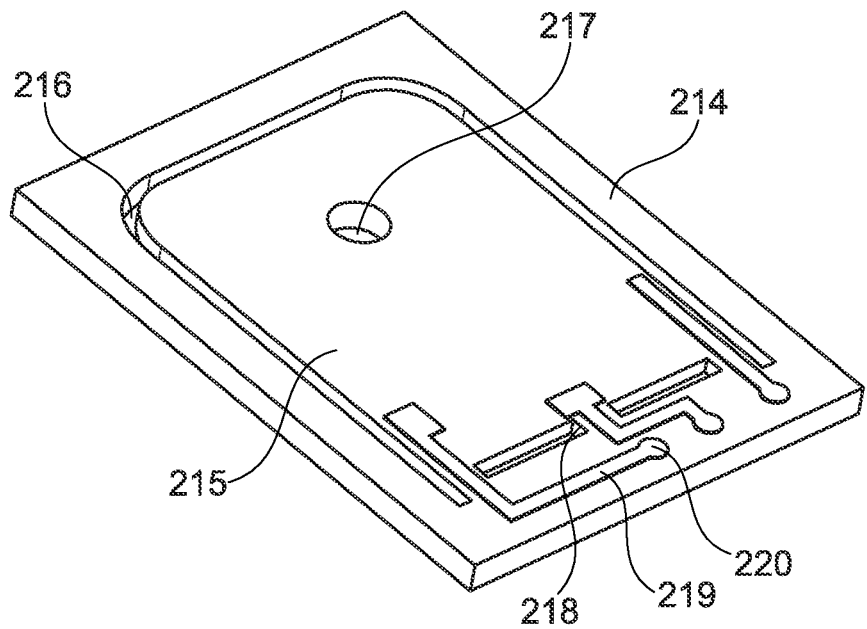
Figure 3:
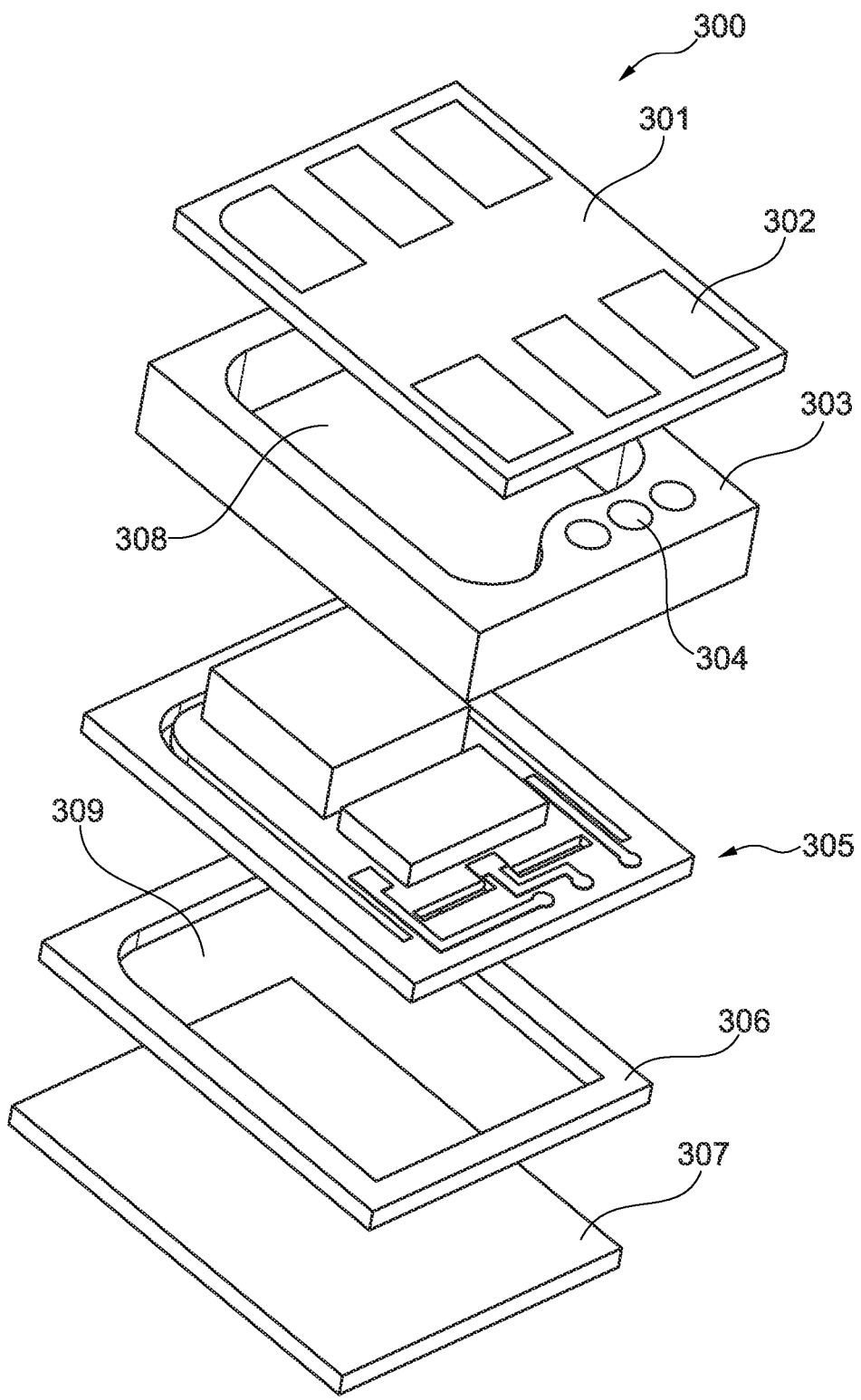
FIG. 3 shows an exploded view of the first embodiment of the present invention.

An embodiment of a vibration sensor according to the present invention is depicted in FIGS. 2 and 3. Referring now to FIG. 2a a pressure generating element comprising a moveable element 202, a pressure transducer 204 and a signal processing circuitry 205 for processing signals from the pressure transducer 204 are depicted. The pressure transducer 204 applied in the embodiment shown in FIG. 2a is MEMS microphone. In the embodiment shown in FIG. 2a the moveable element 202, the pressure transducer 204 and the signal processing circuitry 205 thus constitute, in combination, a moveable mass system being adapted to generate pressure differences.

The pressure transducer 204 and the signal processing circuitry 205 are electrically connected via an appropriate number of wires 206 which may differ from the two wires shown in FIG. 2a. The pressure generating element in the form of the moveable element 202, a pressure transducer 204 and a signal processing circuitry 205 are moveably arranged relative to the static element 201 in that one or more openings 203 are provided between the static element 201 and the moveable element 202. An appropriate number of resilient interconnections or hinges 211, 212, 213 are provided between the static element 201 and the moveable element 202.

In the embodiment shown in FIG. 2a the moveable element 202, the static element 201 and the resilient interconnections or hinges 211, 212, 213 form a one piece component in the form of a PCB having electrically conducting PCB tracks 208, 209, 210 arranged thereon. The PCB tracks 208, 209, 210 ensure that electrical signals may be provided to and/or from the signal processing circuitry 205, i.e. across the resilient interconnections or hinges 211, 212, 213. The signal processing circuitry 205 is electrically connected to the PCB tracks 208, 209, 210 via an appropriate number of wires 207 which may differ from the three wires shown in FIG. 2a. Alternatively, the signal processing circuitry 205 may be electrically connected to the PCB tracks 208, 209, 210 as a surface mounted device (SMD). Similarly, the pressure transducer 204 may be an SMD.

As it will be explained in connection with FIG. 3 the first and second volumes discussed in connection with FIG. 1 will be above and below the arrangement shown in FIG. 2a, respectively. In order to form an acoustic seal between the first and second volumes a viscoelastic substance is arranged in the one or more openings 203 between the static element 201 and the moveable element 202.

It should be noted that if the one or more openings 203 between the static element 201 and the moveable element 202 is/are small enough the resistance of the one or more openings 203 increase to the order of magnitude of a regular compensation hole. Thus, if the one or more openings 203 is/are small enough the one or more openings 203 will function as one or more compensation holes and thus introduce additional low-frequency roll-off. In this implementation no additional sealing measure is needed.

The viscoelastic substance may have a viscosity within the range between 1000 and 100000 cP, such as between 2000 and 80000 cP, such as between 3000 and 50000 cP, such as between 4000 and 40000 cP, such as between 5000 and 30000 cP, such as between 6000 and 20000 cP, such as around 10000 cP. A suitable candidate as a viscoelastic substance may involve oil in that oil is stable over time and it does not tend to evaporate. Moreover, oil comes with a wide range of viscosities. Other suitable candidates as viscoelastic substances may involve gels, magnetic fluids etc.

The PCB forming the static element 214, the moveable element 215 and the integrated resilient interconnections or hinges 218 are shown in greater details in FIG. 2b. Similar to FIG. 2a PCB tracks 219 are arranged across the respective resilient interconnections or hinges 218 that interconnect the static element 214 and the moveable element 215. Each PCB track 219 terminates in a track pad 220 which facilitates further electrical connections. As addressed above one or more openings 216 are provided between the static element 214 and the moveable element 215 so that the moveable element 215 may move relative to the static element 214. Moreover, a viscoelastic substance is arranged in these one or more openings 216 in order to form an acoustic seal between the first and second volumes. As previously addressed the pressure transducer 204, cf. FIG. 2a, is adapted to detect pressure differences between the first and second volumes. In order to do this an acoustical opening 217 is provided in the moveable element 215, cf. FIG. 2b.

Referring now to FIG. 3 an embodiment of a complete vibration sensor 300 is depicted. The pressure generating element involving the moveable element 202, a pressure transducer 204 and a signal processing circuitry 205 for processing signals from the pressure transducer 204, cf. FIG. 2a, are denoted 305 in FIG. 3. As seen in FIG. 3 a spacer 303 is arranged between the assembly 305 and the connection plate 301—the latter having an appropriate number of electrical contact zones 302 that are electrically connected to the contact pads of the assembly 305 via connectors 304 in the spacer 303. As addressed above the pressure transducer of the assembly 305 is adapted to detect pressure differences between a first volume and a second volume. In FIG. 3 the first volume is provided by cavity 308 in the spacer 303, whereas the second volume is provided by the cavity 309 in the spacer 306 which is arranged between the assembly 305 and the top plate 307. Thus, in the vibration sensor shown in FIG. 3 the assembly 305 comprising the moveable element, the pressure transducer and the signal processing circuitry for processing signals from the pressure transducer are arranged between the first and second volumes being defined by cavities 308, 309.

Figure 4A:
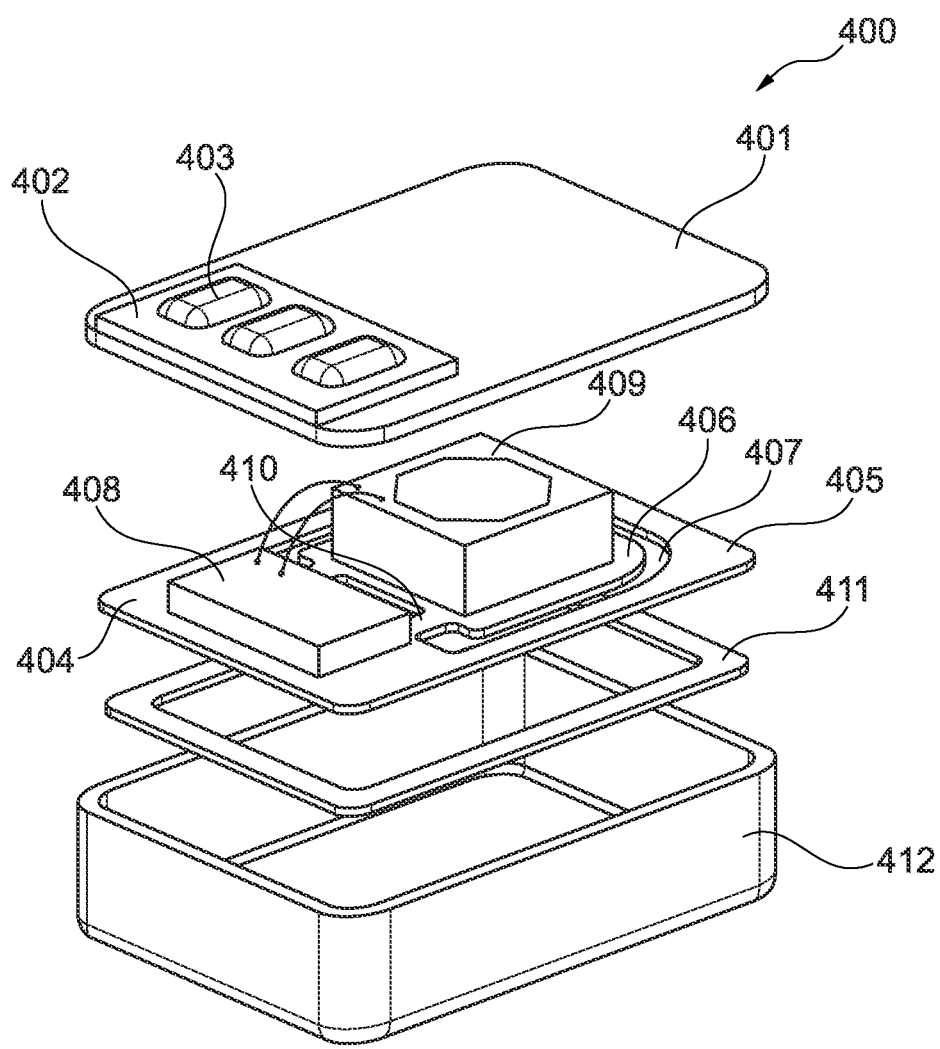
FIG. 4a shows an exploded view of a second embodiment of the present invention.

Another embodiment of a vibration sensor 400 according to the present invention is depicted in FIG. 4. The vibration sensor 400 shown in FIG. 4a comprises a housing 412, a spacer 411 and a cover plate 401 having an appropriate number of electrical connections 403 arranged on a non-conducting plate 402. Moreover, an assembly comprising a static element 404, 405 and a moveable element 406 having a pressure transducer 409 secured thereto. The moveable element 406 and the pressure transducer 409 thus constitute a moveable mass system in combination, whereas the signal processing circuitry 408 for processing signals from the pressure transducer 409 is secured to the static element 404. The moveable element 406 is connected to the static element 404 via an appropriate number of resilient interconnections or hinges 410. Moreover, one or more openings 407 are provided between the moveable element 406 and the static element 404, 405 so that the moveable element 406 is allowed to move relative to the static element 404, 405.

Similar to the embodiment shown in FIGS. 2 and 3 a viscoelastic substance is arranged in the one or more openings 407 in order to form an acoustic seal between a first volume being defined above the assembly of the static element 404, 405 and the moveable element 406, and a second volume being defined by a cavity in the spacer 411.

Figure 4B:
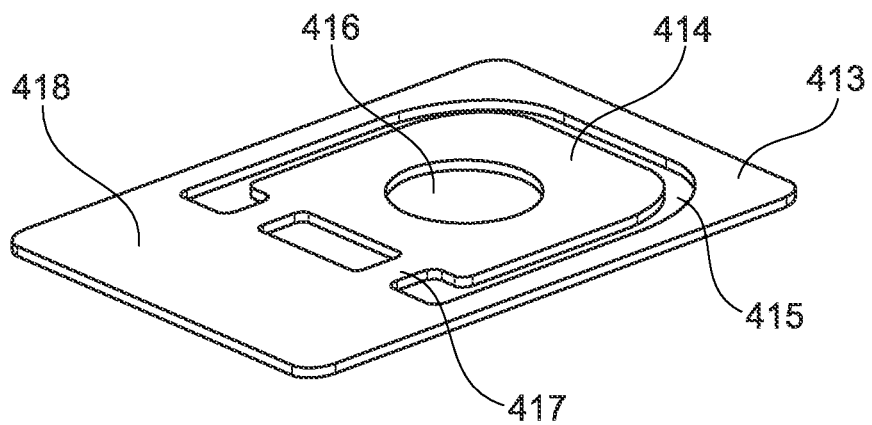

FIG. 4b shows a more detailed view of the static element 413, 418, the moveable element 414, the one or more resilient interconnections or hinges 417 and the one or more openings 415. An acoustical opening 416 is provided in the moveable element 414 so that a pressure transducer (not shown) secured thereto is allowed to detect pressure differences between the first and second volumes. As addressed above a viscoelastic substance is arranged in the one or more openings 415 in order to form an acoustic seal between the first and second volumes. The static element 413, 418, the moveable element 414, and the one or more resilient interconnections or hinges 417 may be implemented as a one piece component, or they may be assembled using different materials, such as one material for the static element 413, 418, another material for the moveable element 414, and a third material for the one or more resilient interconnections or hinges 417.

Figure 5A:
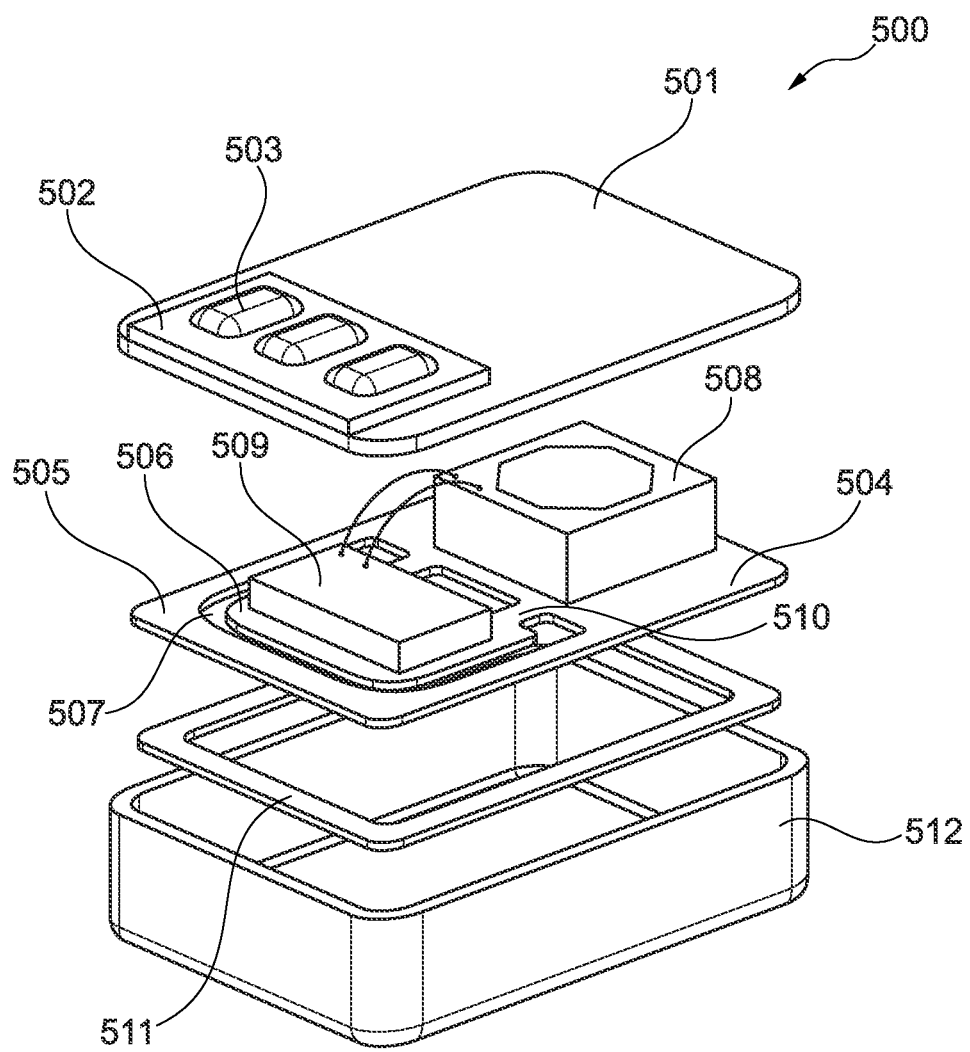
FIG. 5a shows an exploded view of a third embodiment of the present invention.

Referring now to FIG. 5, yet another embodiment 500 of the vibration sensor of the present invention is depicted. Compared to the embodiment shown in FIG. 4 the pressure transducer 508 is now secured to the static element 504, 505, whereas the signal processing circuitry 509 constitutes a moveable mass system together with the moveable element 506 which is connected to the static element 504 via one or more resilient interconnections or hinges 510. A viscoelastic substance is provided in the one or more openings 507 in order to form an acoustic seal between a first volume being defined above the assembly of the static element 504, 505 and the moveable element 506, and a second volume being defined by a cavity in the spacer 511. The vibration sensor 500 further comprises a housing 512, a spacer 511 and a cover plate 501 having an appropriate number of electrical connections 503 arranged on a non-conducting plate 502.

Figure 5B:
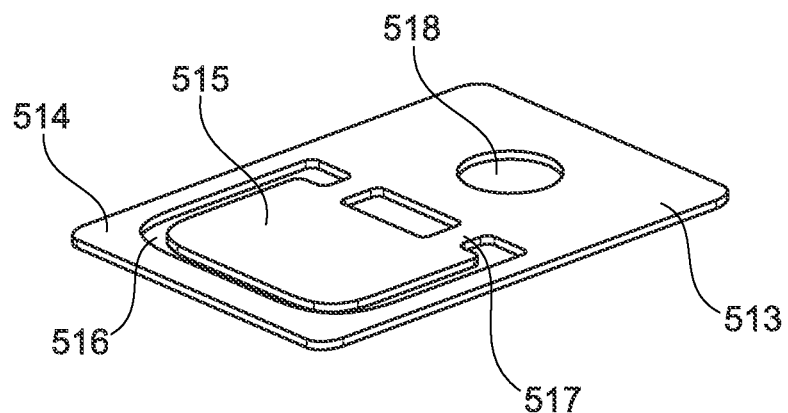

FIG. 5b shows a more detailed view of the static element 513, 514, the moveable element 515, the one or more resilient interconnections or hinges 517 and the one or more openings 516. An acoustical opening 518 is provided in the static element 518 so that a pressure transducer (not shown) secured thereto is allowed to detect pressure differences between the first and second volumes within the housing 512. As already discussed a viscoelastic substance is arranged in the one or more openings 516 in order to form an acoustic seal between the first and second volumes. Similar to the embodiment shown in FIG. 4 the static element 513, 514, the moveable element 515, and the one or more resilient interconnections or hinges 517 may be implemented as a one piece component, or they may be assembled using different materials, such as one material for the static element 513, 514 another material for the moveable element 515, and a third material for the one or more resilient interconnections or hinges 517.

As depicted in FIGS. 2-5 pressure transducers 204, 409, 508 and the associated signal processing circuitries 205, 408, 509 are arranged next to each other, i.e. on the same level, in order not to increase the height of the vibration sensor.

Figure 6:
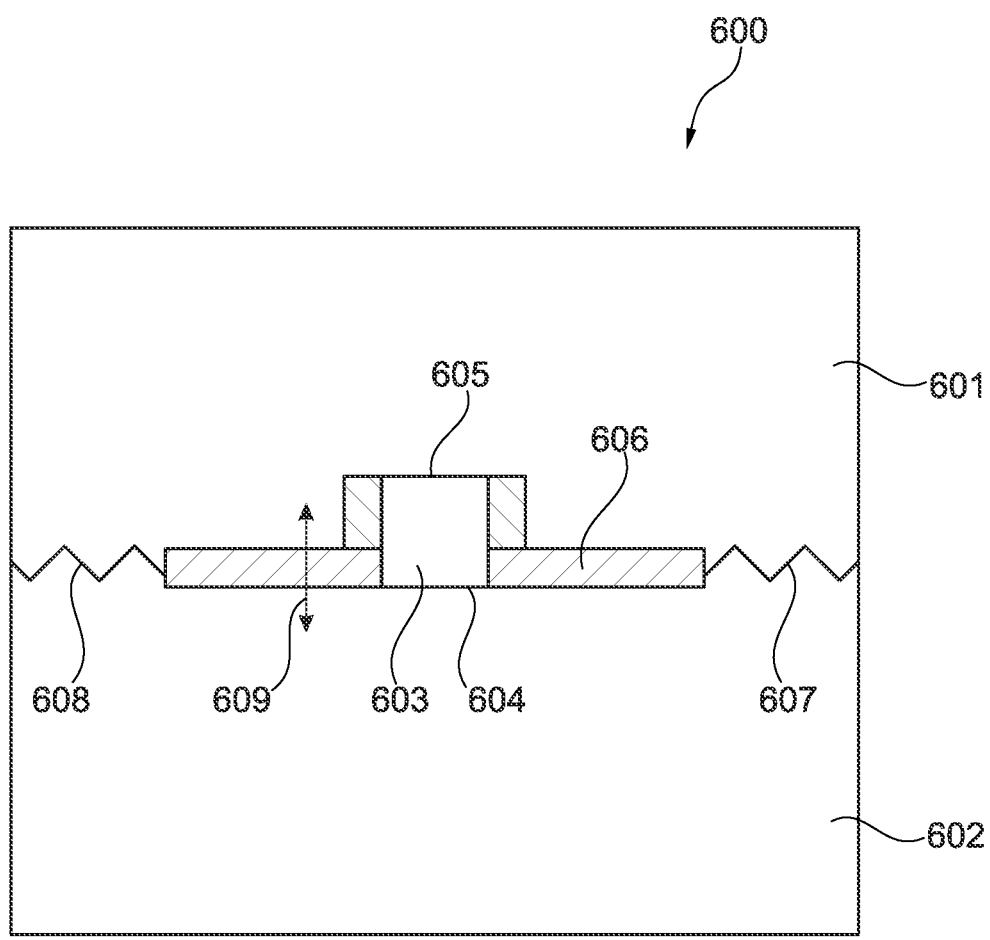
FIG. 6 shows a fourth embodiment of the present invention.

FIG. 6 shows yet another embodiment 600 of the present invention wherein a moveable mass system is suspended between a first volume 601 and a second volume 602 using suspension elements 607, 608. The moveable mass system comprises a moveable element 606 onto which a MEMS pressure transducer is secured. The moveable element 606 and the MEMS pressure transducer thus form, in combination, a pressure generating element which is capable of moving as indicated by the arrow 609 in response to vibrations of the vibration sensor. The MEMS pressure transducer is in the form of a MEMS microphone comprises a moveable diaphragm 605 being capable of detecting pressure differences between the first and second volumes 601, 602. Moreover, a third volume 603 and a high compliant moveable diaphragm 604 are provided.

Figure 7:
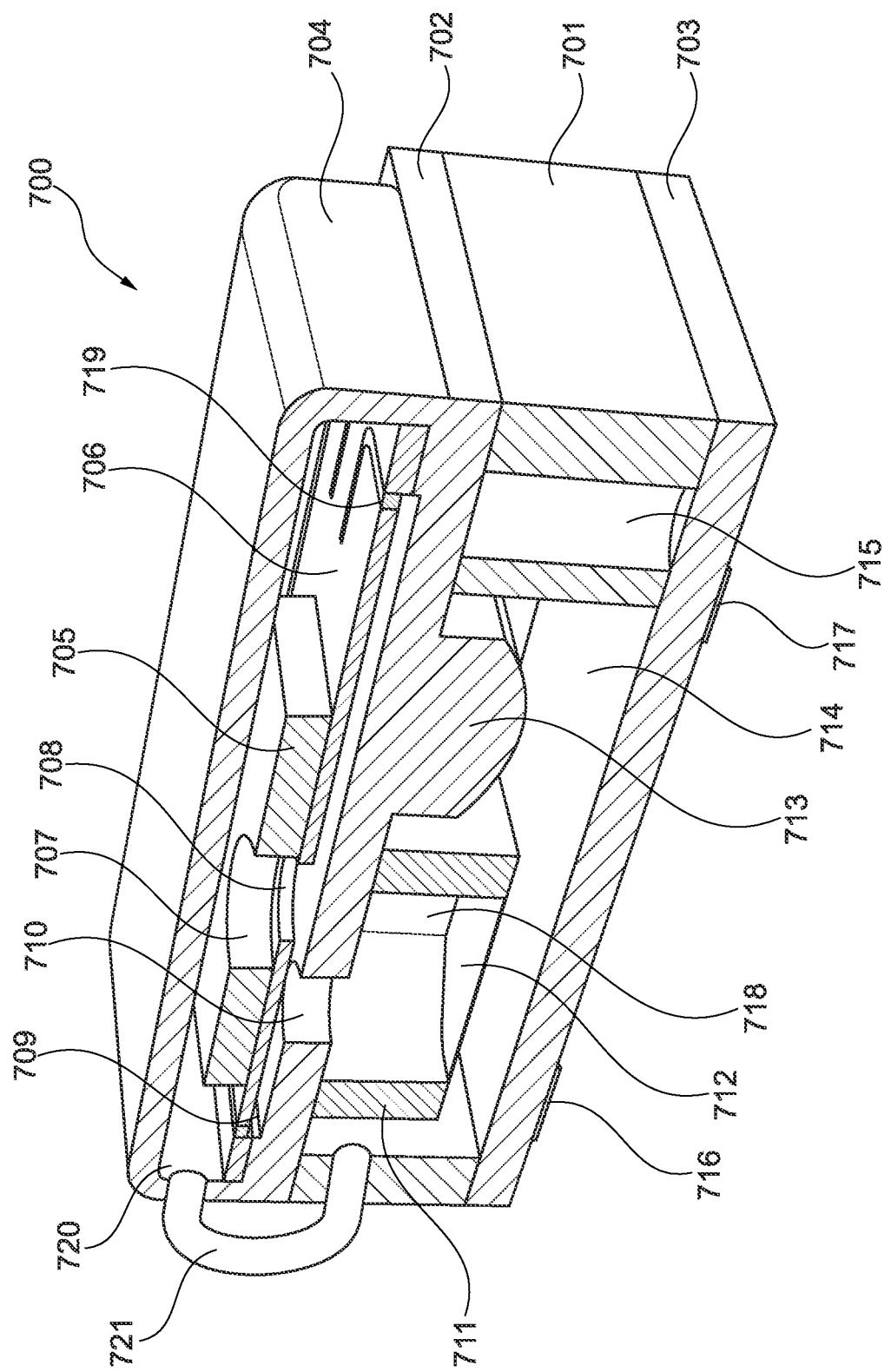
FIG. 7 shows a fifth embodiment of the present invention.

FIG. 7 shows another embodiment of a vibration sensor 700 comprising a MEMS microphone and a pressure generator arranged on top of the MEMS microphone. The MEMS microphone may apply various technologies, including piezo, charged plate capacitor etc. The signal processing of the MEMS microphone may be analog or digital applying any digital coding scheme.

The MEMS microphone comprises a housing having a top PCB 702 and a bottom PCB 703 on which electrodes 716, 717 for electrically connecting the vibration sensor 700 are provided. The electrodes 716, 717 may be in the form of solder pads.

An acoustical opening 710 is provided in the top PCB 702. A wall portion 701 is provided between the top PCB 702 and the bottom PCB 703. Within the MEMS microphone a MEMS cartridge 711 comprising a membrane 712 and a front chamber 718 is provided. The MEMS microphone further comprises a back chamber 714 within which back chamber 714 a signal processor circuitry 713 and one or more via's 715 are provided. As addressed above a pressure generator is arranged on top of the MEMS microphone. As seen in FIG. 7 the pressure generator is secured to the top PCB 702. The pressure generator comprises a housing 704, a pressure generating element 706 and a moveable mass 705 secured to the pressure generating element 706. The pressure generating element 706 and the moveable mass 705 comprise respective acoustical openings 708 and 707.

The housing 704 of the pressure generator can be made of any suitable material as long as it seals the inside completely. Preferably, a thin metal shield is applied. A small hole introducing a low-frequency roll off below 10 Hz may be allowed as such a small hole does not introduce dominant acoustic noise.

The mass of the moveable mass 705 is preferable around 4 mg. It is estimated that the practical minimum mass would be around 0.004 mg as this would add +30 dB to the noise. Similarly, a mass of 0.04 mg would add +20 dB to the noise, and a mass of 0.4 mg would add +10 dB to the noise. Thus, the higher the mass of the moveable mass the lower is the effect of the thermal movement noise of the vibration sensor.

The area of the pressure generating element 706 and the moveable mass 705 should be as large as possible, and preferably larger than 0.5 mm$^2$, such as larger than 1 mm$^2$, such as larger than 2 mm$^2$, such as larger than 4 mm$^2$, such as larger than 6 mm$^2$, such as larger than 8 mm$^2$, such as larger than 10 mm$^2$. A large area of the pressure generating element 706 and the moveable mass 705 is advantageous as this requires a smaller amplitude of the movement of the moveable mass 705 in order to reach certain volume displacement and thereby sensitivity.

As seen in FIG. 7, a small volume 709 exists between the pressure generating element 706 and the upper side of the top PCB 702. The volume should be as small as possible, and preferably smaller than 5 mm$^3$, such as smaller than 2 mm$^3$, such as smaller than 1 mm$^3$, such as smaller than 0.75 mm³, such as smaller than 0.5 mm³, such as smaller than 0.25 mm³, such as smaller than 0.1 mm³.

A compliant sealing 719 in the form of for example a foil, membrane, viscoelastic substance or gel is preferably provided along the edges of the pressure generating element 706. Preferably, the compliant sealing should have a low stiffness and it should be able to withstand reflow temperatures.

The volume 720 above the pressure generating element 706 and the moveable mass 705 is acoustically connected to the back volume 714 of the MEMS microphone via the channel or tube 721.

The invention claimed is:

1. A vibration sensor comprising:
   a pressure generating element for generating pressure differences between a first volume and a second volume in response to vibrations of the vibration sensor, the first and second volumes being acoustically sealed from each other, wherein the pressure generating element includes a moveable element that is configured to interact directly with air of the first and second volumes; and
   a pressure transducer for measuring pressure differences between the first and second volumes, wherein the pressure transducer and the pressure generating element are arranged in parallel relative to the first and second volumes, wherein the pressure generating element and the pressure transducer are arranged adjacent to each other such that the pressure generating element and the pressure transducer are directly exposed to portions of the first and second volumes.

2. A vibration sensor according to claim 1, wherein the vibration sensor further comprises a static element, the static element being operatively connected to the moveable element of the pressure generating element via one or more resilient interconnections.

3. A vibration sensor according to claim 2, wherein the static and moveable elements, and the one or more resilient interconnections form, in combination, a one piece component, and wherein one or more openings are provided between the static element and the moveable element.

4. A vibration sensor according to claim 3, wherein the static and moveable elements, and the one or more resilient interconnections, are formed by a printed circuit board having one or more electrically conducting paths arranged thereon.

5. A vibration sensor according to claim 3, wherein a viscoelastic substance is arranged in the one or more openings between the static element and the moveable element so as to form an acoustic seal therebetween.

6. A vibration sensor according to claim 2, wherein the static and moveable elements, and the one or more resilient interconnections constitute discrete components of different materials, and wherein one or more openings are provided between the static element and the moveable element.

7. A vibration sensor according to claim 2, wherein the pressure transducer is secured to the moveable element or the static element.

8. A vibration sensor according to claim 7, wherein a signal processing circuitry for processing signals from the pressure transducer is secured to the moveable element or the static element.

9. A vibration sensor according to claim 8, wherein the pressure transducer and the signal processing circuitry are arranged next to each other.

10. A vibration sensor according to claim 1, wherein the pressure transducer comprises a MEMS pressure transducer.

11. A vibration sensor according to claim 1, wherein the vibration sensor is contained within a personal device selected from the group consisting of hearing aids, hearing devices, hearables, mobile communication devices and tablets.

12. A vibration sensor comprising:
    a pressure generating element for generating pressure differences between a first volume and a second volume in response to vibrations of the vibration sensor, the first and second volumes being acoustically sealed from each other; and
    a pressure transducer for measuring pressure differences between the first and second volumes, wherein the pressure transducer and the pressure generating element are arranged in parallel relative to the first and second volumes,
    wherein the pressure generating element and the pressure transducer form part of an arrangement that acoustically seals the first volume from the second volume.

13. A vibration sensor comprising:
    a pressure generating element for generating pressure differences between a first volume and a second volume in response to vibrations of the vibration sensor, the first and second volumes being acoustically sealed from each other; and
    a pressure transducer for measuring pressure differences between the first and second volumes, wherein both of the pressure transducer and the pressure generating element are directly fluidically connected to the first and second volumes.

14. A vibration sensor according to claim 13, wherein the pressure generating element moves or bends in response to the vibrations of the vibration sensor to generate the pressure differences between the first volume and the second volume.

15. A vibration sensor according to claim 13, wherein the pressure generating element directly interacts with air of the first and second volumes.

16. A method for detecting vibrations in a device having a pressure generating element and a pressure transducer that are both directly fluidically connected to a first volume and a second volume, the first volume and the second volume being acoustically sealed from each other, the method comprising:
    causing, by movement of the pressure generating element in response to the vibrations, pressure differences between the first volume and the second volume; and
    measuring, via the pressure transducer, the pressure differences between the first volume and the second volume.

17. A method according to claim 16, wherein the pressure generating element is adapted to interact directly with air of the first and second volumes.

18. A method according to claim 16, wherein the causing comprises:
    in response to the vibrations, moving at least a part of the pressure generating element toward the first volume and away from the second volume.

19. A vibration sensor comprising:
    a pressure generating element for generating pressure differences between a first volume and a second volume in response to vibrations of the vibration sensor, the first and second volumes being acoustically sealed from each other;
    a pressure transducer for measuring pressure differences between the first and second volumes, wherein the pressure transducer and the pressure generating element are arranged in parallel relative to the first and second volumes; and a static element, the static element being operatively connected to a moveable element of the pressure generating element via one or more resilient interconnections;

wherein the static and moveable elements, and the one or more resilient interconnections form, in combination, a one piece component, and wherein one or more openings are provided between the static element and the moveable element; and wherein the static and moveable elements, and the one or more resilient interconnections, are formed by a printed circuit board having one or more electrically conducting paths arranged thereon.

20. A vibration sensor comprising:

a pressure generating element for generating pressure differences between a first volume and a second volume in response to vibrations of the vibration sensor, the first and second volumes being acoustically sealed from each other;

a pressure transducer for measuring pressure differences between the first and second volumes, wherein the pressure transducer and the pressure generating element are arranged in parallel relative to the first and second volumes; and a static element, the static element being operatively connected to a moveable element of the pressure generating element via one or more resilient interconnections;

wherein the static and moveable elements, and the one or more resilient interconnections form, in combination, a one piece component, and wherein one or more openings are provided between the static element and the moveable element; and wherein a viscoelastic substance is arranged in the one or more openings between the static element and the moveable element so as to form an acoustic seal therebetween.

21. A vibration sensor comprising:

a pressure generating element for generating pressure differences between a first volume and a second volume in response to vibrations of the vibration sensor, the first and second volumes being acoustically sealed from each other;

a pressure transducer for measuring pressure differences between the first and second volumes, wherein the pressure transducer and the pressure generating element are arranged in parallel relative to the first and second volumes; and a static element, the static element being operatively connected to a moveable element of the pressure generating element via one or more resilient interconnections;

wherein the static and moveable elements, and the one or more resilient interconnections constitute discrete components of different materials, and wherein one or more openings are provided between the static element and the moveable element.

22. A vibration sensor comprising:

a pressure generating element for generating pressure differences between a first volume and a second volume in response to vibrations of the vibration sensor, the first and second volumes being acoustically sealed from each other;

a pressure transducer for measuring pressure differences between the first and second volumes, wherein the pressure transducer and the pressure generating element are arranged in parallel relative to the first and second volumes; and a static element, the static element being operatively connected to a moveable element of the pressure generating element via one or more resilient interconnections;

wherein the pressure transducer is secured to the moveable element or the static element; and wherein a signal processing circuitry for processing signals from the pressure transducer is secured to the moveable element or the static element.

23. A vibration sensor according to claim 22, wherein the pressure transducer and the signal processing circuitry are arranged next to each other.

* * * * *